United States Patent
Rahman et al.

(10) Patent No.: US 6,560,447 B2
(45) Date of Patent: May 6, 2003

(54) DC OFFSET CORRECTION SCHEME FOR WIRELESS RECEIVERS

(75) Inventors: Mahibur Rahman, Boynton Beach, FL (US); Christopher T. Thomas, San Diego, CA (US); Robert Schweickert, Mesa, AZ (US); James Mittel, Lake Worth, FL (US); Clinton C. Powell, II, Lake Worth, FL (US)

(73) Assignee: Motorola, Inc., Schaumburg, IL (US)

( * ) Notice: Subject to any disclaimer, the term of this patent is extended or adjusted under 35 U.S.C. 154(b) by 94 days.

(21) Appl. No.: 09/798,216

(22) Filed: Mar. 5, 2001

(65) Prior Publication Data

US 2002/0151289 A1 Oct. 17, 2002

(51) Int. Cl.$^7$ .................................................. H04B 1/06
(52) U.S. Cl. .............................. 455/232.1; 455/240.1; 375/319; 375/345
(58) Field of Search .......................... 455/232.1, 234.1, 455/239.1, 240.1, 296, 250.1, 251.1, 255, 256, 266, 313, 334, 339; 375/319, 324, 345, 346

(56) References Cited

U.S. PATENT DOCUMENTS

| | | | |
|---|---|---|---|
| 5,471,665 A | 11/1995 | Pace et al. | 455/343 |
| 5,724,653 A * | 3/1998 | Baker et al. | 455/296 |
| 6,009,126 A * | 12/1999 | Van Bezooijen | 375/319 |
| 6,081,558 A | 6/2000 | North | 375/316 |
| 6,366,622 B1 * | 4/2002 | Brown et al. | 375/345 |

FOREIGN PATENT DOCUMENTS

GB    2328353 A  *  2/1999  ........... H04L/27/38

* cited by examiner

Primary Examiner—Quochien Vuong
(74) Attorney, Agent, or Firm—Randi L. Dulaney

(57) ABSTRACT

A DC offset correction circuit (68) provides DC offset correction within a receiver (50) for receiving and processing a radio frequency signal (28) within a radio communication system (30). The DC offset correction circuit (68) includes a feedback loop (88) for shifting a digital signal (80) by a programmable amount; and a coarse DC offset correction path (104) coupled to the feedback loop (88) for performing coarse DC offset correction.

8 Claims, 7 Drawing Sheets

DC OFFSET CORRECTION SCHEME FOR WIRELESS RECEIVERS

BACKGROUND OF THE INVENTION

1. Field of the Invention

This invention relates in general to electronic circuits and in particular to DC offset correction circuits.

2. Description of the Related Art

Product designers today are being challenged to continuously create smaller and yet more sophisticated and more powerful electronic communication devices. To achieve this smaller size and more powerful performance, direct conversion and very low intermediate frequency (VLIF) receiver circuits are frequently used in radio architectures.

The forward gain path for a direct conversion or very low intermediate frequency receiver has substantial power and/or voltage gain. The amplifiers in the forward gain path have some static or direct current (DC) offset from their respective differential input stages, current mirrors, etc. that are amplified at the their output stage. This DC offset manifests itself as a progressively degraded signal dynamic range in the forward gain path from the radio frequency (RF) frontend to the demodulator backend. Thus a DC offset correction scheme is required to ensure that the optimum signal dynamic range of each of the blocks within the forward gain path is maintained. Failure to do so will result in one or more of the forward gain blocks to clip the incoming signal thereby generating severe amounts of in-band harmonic distortion.

The DC offset correction loop is viewed as an essential requirement in direct-conversion receivers. Traditionally, a continuous time (C.T.) analog DC offset correction loop has been employed. A conventional receiver 10 utilized in radio communication systems and employing a C.T. analog DC offset correction loop is illustrated in FIG. 1. The conventional receiver 10 includes an antenna 12, a preselector 13, a radio frequency (RF) amplifier 14, a radio frequency (RF) mixer 16, an intermediate frequency (IF) filter 18, an intermediate frequency (IF) amplifier 20, an intermediate frequency (IF) mixer 22, a low pass filter 24, and an analog DC offset circuit 26.

The conventional receiver 10 receives a radio frequency (RF) signal 28 sent from a radio communication system 30 that is in a digital format or an analog format using the antenna 12. The preselector 13 filters the received RF signal 28 and passes it to the RF amplifier 14. The RF amplifier 14 then amplifies the radio frequency (RF) signal 28 and passes an amplified RF signal 32. The RF mixer 16 is coupled to a local oscillator 36 so as to produce an intermediate frequency (IF) signal 34 which can be, for example, a very low IF signal or a Zero-IF signal. The frequency of the IF signal 34 is the separation in frequency between the radio frequency signal and the local oscillator signals. The filter 18 generates a filtered IF signal 38 as well as removes spurious components of the IF signal 34 to improve the selectivity of the receiver and reduce the adjacent channel interference.

The intermediate frequency (IF) amplifier 20, which is coupled to the filter 18, is used to amplify the filtered IF signal 38 thereby generating an amplified IF signal 40. The IF mixer 22 then mixes the amplified IF signal 40 down to base band using a reference frequency 42 to produce a baseband signal 44. The IF filter 24 filters the baseband signal 44 to generate an output signal 46. The output signal 46 is passed to the backend 48 for further processing, such as demodulation. The analog DC offset circuit 26 is coupled between the backend 48 and the IF mixer 22 for analog correction of the output signal 46.

With an analog approach such as the conventional receiver of FIG. 1, the offsets are corrected quickly in wide bandwidth mode but the analog correction circuitry must be very precise itself. If the correction system is driven into a non-linear state because the offsets exceed the correction range or because there is excessive base band gain, the correction will be slew rate limited and may not meet the required correction cycle time of the loop. Further, loop analysis shows that such a C.T. analog DC offset loop creates a high-pass response in the forward gain path, wherein the high-pass corner is in the tens to hundreds of Hertz range. It has the tendency to track the incoming signal (not desired) if the bandwidth of the correction loop is made too large, for example greater than 30 Hertz (Hz) in frequency modulation (FM) voice applications. Yet if it is eliminated there will be a corresponding loss of signal dynamic range and clipping in the forward gain path. For direct conversion receivers this high pass corner creates a "hole" in the desired signal bandwidth, which results in a finite Bit Error Rate (BER) floor. In very low intermediate frequency (VLIF) receiver applications, the loop correction bandwidth can be made much larger as long as the lower half of the information bandwidth is greater than 0 Hertz. For example, the loop correction bandwidth in VLIF Global System for Mobile Communications (GSM) compatible integrated circuits is typically 10 Kilohertz (kHz) to 190 kHz. The variation in the analog components of the DC offset correction loop, however, create distortions, which leak into the forward gain path also resulting in degraded radio performance. These problems in the analog approach have led engineers to consider digital implementations.

Digital implementations provide numerous benefits over analog implementations. These benefits include precision repeatability, ease of loop bandwidth adjustment, and performance independence from temperature, process, and voltage variations. Digital implementations also allow for complete control of the loop dynamics, start and stop times, and initial conditions.

What is needed is a digital correction technique to eliminate coarse and fine DC offsets in an efficient, cost effective manner.

DETAILED DESCRIPTION OF THE INVENTION

Figure 1:
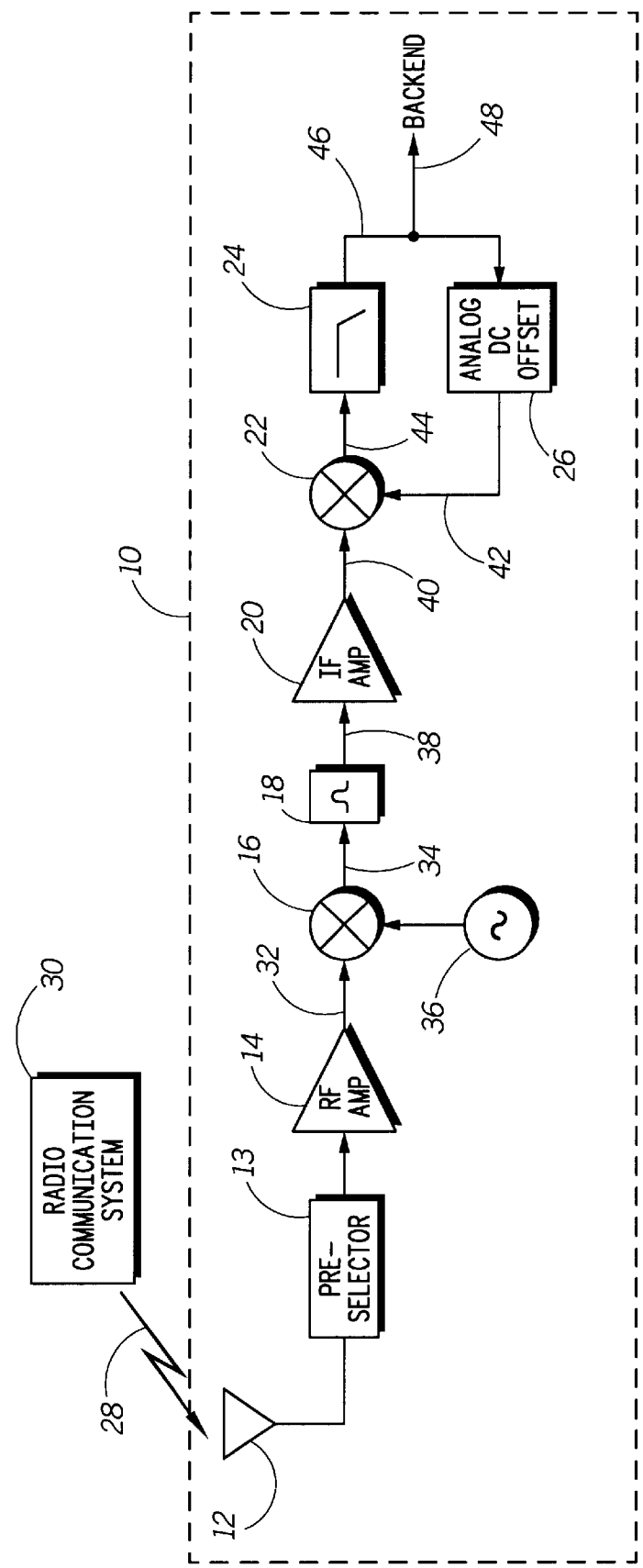
FIG. 1 is a block diagram of a conventional receiver employing an analog DC offset correction loop.
Figure 2:
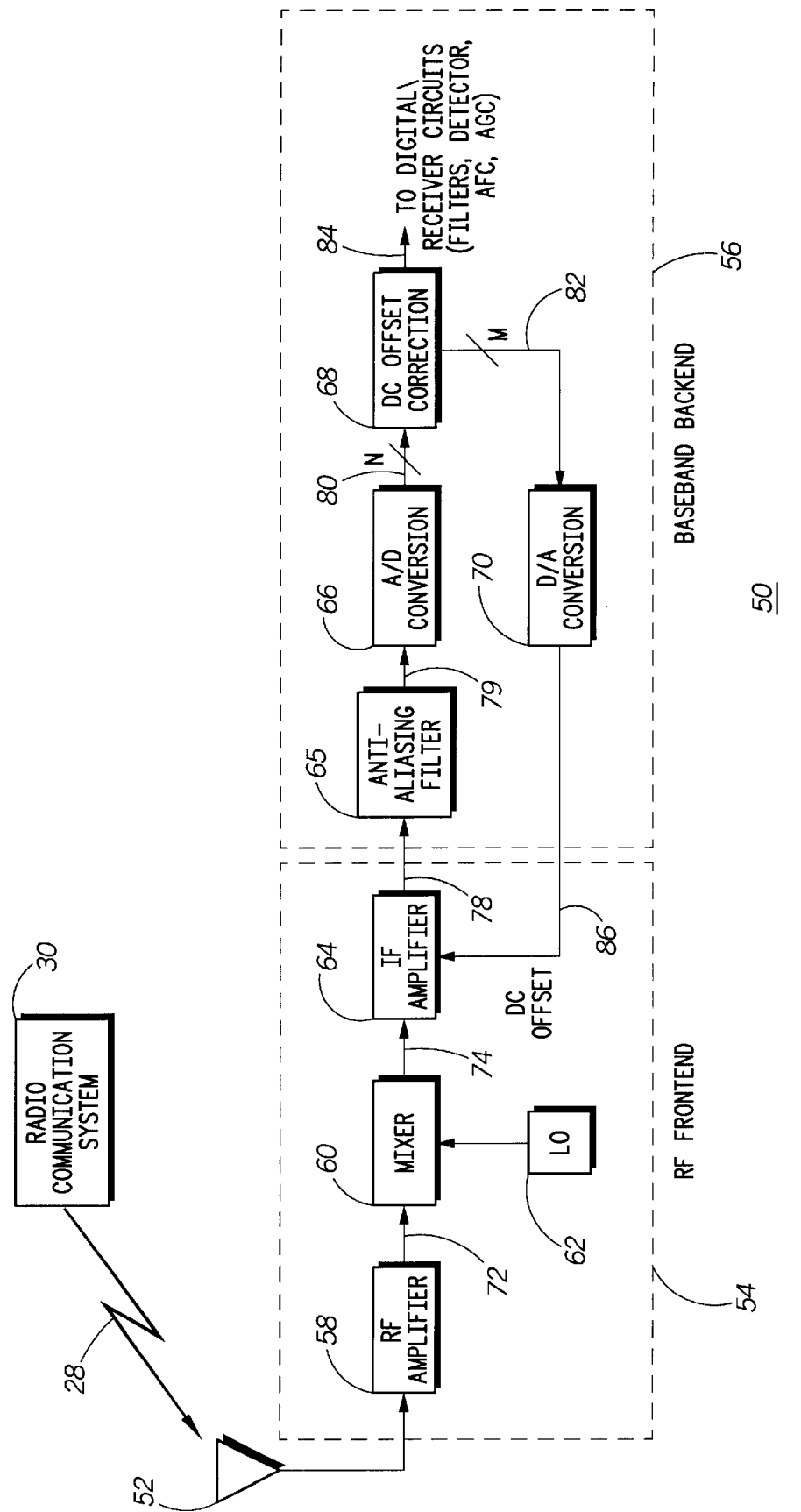
FIG. 2 is a functional block diagram of a receiver employing a DC offset correction circuit.

Referring to FIG. 2, a functional block diagram of a receiver 50 operating in accordance with the present invention is illustrated. The receiver 50 includes a receiver antenna 52, a radio frequency (RF) frontend 54 and a baseband backend 56.

The receiver 50 receives the radio frequency (RF) signal 28 sent from the radio communication system 30 that is in a digital format or an analog format using the receiver antenna 52. Coupled to the receiver antenna 52 is the RF frontend 54. The RF frontend 54 preferably includes a receiver radio frequency (RF) amplifier 58, a receiver radio frequency (RF) mixer 60, a receiver local oscillator 62, and a receiver intermediate frequency (IF) amplifier 64. The RF amplifier 58 selects the desired portion within the band of frequencies of the RF signal 28, and then amplifies the desired portion, thereby generating a desired signal 72. The RF mixer 60 is coupled to the output of the RF amplifier 58 and is also coupled to the output of the receiver local oscillator 62. The RF mixer 60 converts the desired signal 72 to a baseband signal 74 using the local oscillator signal 76 generated by the receiver local oscillator 62. The receiver IF amplifier 64 is coupled to the output of the RF mixer 60 and receives the baseband signal 74. The receiver IF amplifier 64 provides programmable IF gain to amplify the baseband signal 74, thereby generating an IF amplifier output 78.

The IF amplifier output 78 signal is the input signal to the baseband backend 56. The baseband backend 56 preferably includes an anti-aliasing filter 65, an analog to digital (A/D) converter 66, a DC offset correction circuit 68, and a digital to analog (D/A) converter 70. The anti-aliasing filter 65 is coupled to the output of the receiver IF amplifier 64 and receives the IF amplifier output 78. The anti-aliasing filter 65 is preferably a one-pole filter that provides attenuation to out of band frequencies, thereby generating an anti-aliasing filter output 79. The analog to digital converter 66 is coupled to the output of the anti-aliasing filter 65 and receives the anti-aliasing filter output 79. One skilled in the art will recognize that the analog to digital converter 66 can also be any equivalent analog to digital converter. The analog to digital converter 66 converts the IF amplifier output 78 from an analog format to a digital format. The analog to digital converter 66 converts the IF amplifier output 78 to a digital signal 80 having N bits of digital resolution to allow for digital detection of the desired signal. In addition to performing digital demodulation, in one embodiment the baseband backend includes a digital automatic frequency control (AFC) circuit (not shown) and a digital automatic gain control (AGC) circuit (not shown) following the analog to digital converter 66. The drawback of utilization of these circuits is the performance degradation of the receiver 50 due to the high likelihood of a strong DC offset in the baseband spectrum.

It is, therefore, highly desirable to have a strategy to eliminate this DC term before it reaches the detector, the AFC, or the AGC circuits. The present invention includes a strategy of using the DC offset correction circuit 68, a programmable circuit that can operate in either a feedback or feedforward manner. One purpose of the DC offset correction circuit 68 is to avoid clipping and preserve dynamic range of the anti-aliasing filter 65 and the analog to digital converter 66. Further, the DC offset correction circuit 68 minimizes DC offsets, thereby maximizing receiver performance under varying signal conditions.

The DC offset correction circuit 68 is coupled to the output of the analog to digital converter 66 and receives the digital signal 80. The DC offset correction circuit 68 calculates the average DC offset and corrects it, thereby generating a first offset correction signal 82, which is input to the digital to analog converter 70. The DC offset correction circuit 68 also generates a second offset correction signal 84, which is fed to the digital receiver circuits.

The feedback path is used during periodic warm-up sequences (i.e.: after battery save cycles) to eliminate coarse DC offsets which can occur due to temperature, process, and voltage variations in the RF frontend 54 while the receiver 50 is turned off. The primary reason to eliminate such coarse DC offsets is to ensure that the dynamic range of the anti-naliasing filter 65 and the analog to digital converter 66 is preserved. The specified feedback path involves conversion of the first offset correction signal 82 to analog form using the digital to analog (D/A) converter 70, which is preferably an M-bit D/A converter, thereby generating an analog signal 86. "M" is defined as the bit width of the digital to analog converter 70. The analog signal 86 is then used to DC bias the single ended or differential ended signal at the output of the receiver IF amplifier 64. In addition, the feedforward DC offset correction path is employed to eliminate residual DC offsets which the feedback path has not previously corrected as well as to eliminate dynamic DC offsets while the receiver 50 is on. The latter type of dynamic DC offset can occur due to mixer LO self-reception. Also, by using the output of the analog to digital converter 66 as the input to the DC offset correction circuit 68, the DC offset correction circuit 68 acquires the DC offset very rapidly. This yields an order of magnitude better performance than prior art circuits.

The receiver 50 as illustrated in FIG. 2 and described herein provides an electronic circuit for use in radio communication systems including an area-efficient, high-gain, high-speed DC offset correction loop. In the present invention, by feeding back the second offset correction signal 84 to the receiver IF amplifier 64, extra hardware for gain compensation is not required. Further, the DC offset correction circuit gain is independent of the gain of the receiver IF amplifier 64.

Figure 3:
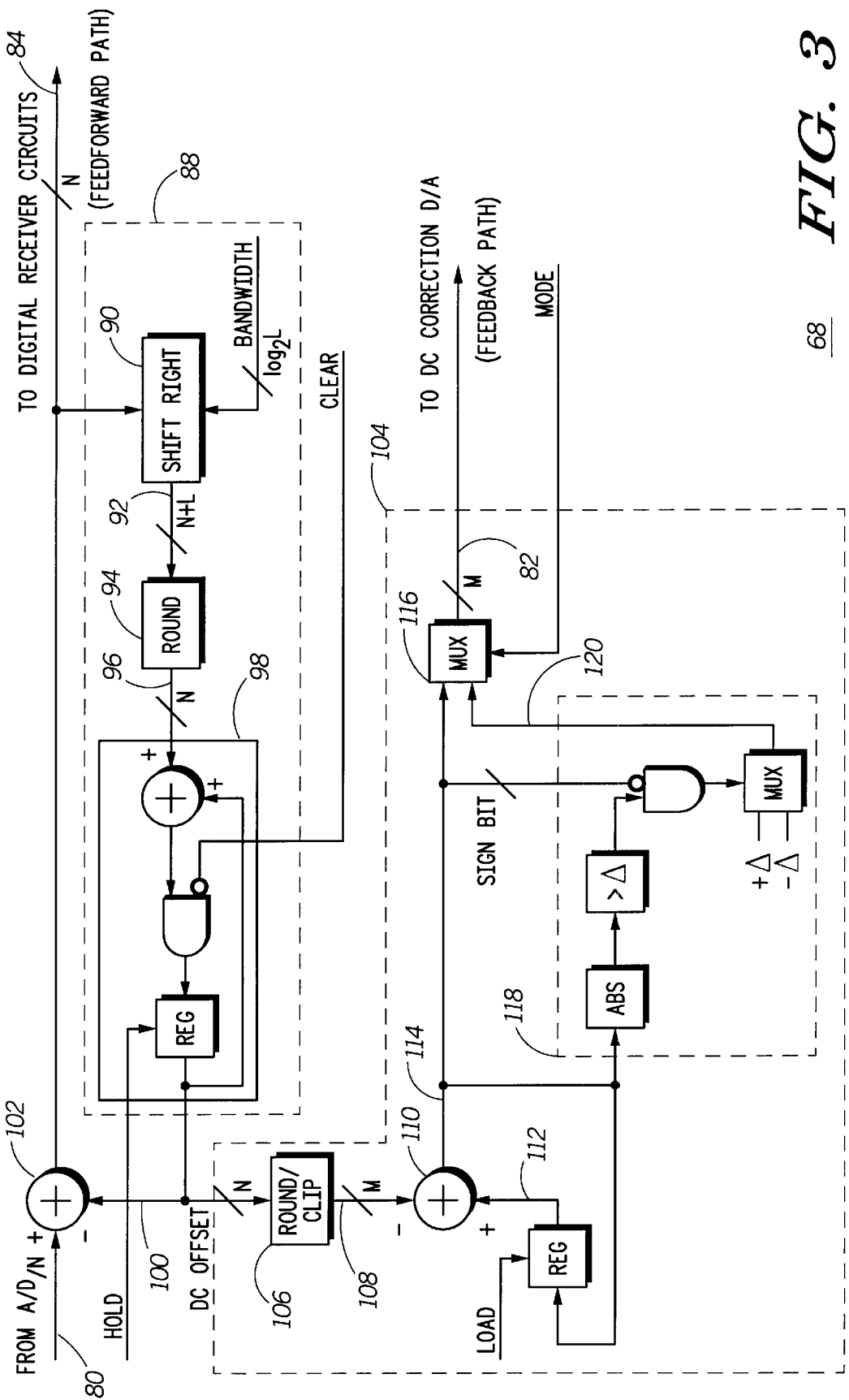
FIG. 3 illustrates one embodiment of a hardware architecture of the DC offset correction circuit of FIG. 2 in accordance with the present invention.

FIG. 3 illustrates one embodiment of a hardware architecture of the DC offset correction circuit 68 of FIG. 2 in accordance with the present invention. The DC offset correction circuit 68 is a low cost infinite impulse response (IIR) type of high pass filter with a programmable 3 dB corner frequency (or bandwidth). The IIR type filter is preferably utilized because the 3dB high pass corner frequency is tunable in a very cost efficient manner. Alternatively, the DC offset correction circuit 68 is a finite impulse response (FIR) circuit. It will be appreciated by one of ordinary skill in the art that the DC offset correction circuit 68, in accordance with the present invention, can function utilizing the above filters or an equivalent.

The DC offset correction circuit 68 preferably includes a feedback loop 88 which shifts right (or scales down) the digital signal 80 by a programmable amount. The feedback loop 88 preferably includes a shifter 90, a rounder 94, and an integrator 98. This programmable amount is directly related to the high pass filter corner frequency. The value of "L" defines the maximum amount of right shifting allowed in a given system. The rounder 94 receives the output of the shifter 90 including the shifted signal 92. The rounder 94 performs rounding of the "N+L" bit output of the right shifter to N bits to eliminate a significant DC component that would otherwise be created if truncation were used. The rounded signal 96, the output of the rounder 94, is then averaged in the integrator 98, thereby generating an average DC offset 100. The first subtractor 102 subtracts the average DC offset 100 from the digital signal 80.

Larger amounts of right shifting correspond to a larger closed-loop time constant and hence a lower corner frequency. Thus, the amount of right shifting performed in the feedback path is inversely related to the bandwidth. The transfer function of the DC offset correction circuit 68 in accordance with the present invention as illustrated in FIG. 3 is as follows:

$$H(z) = \frac{(1-z^{-1})}{1-(1-2^{-n})z^{-1}}$$

where "n" indicates the number of bits to right shift. Thus, this term "n" defines the high pass filter 3 dB corner frequency in a programmable manner. Note that the largest value of "n" supported in a given system corresponds to the parameter "L" in FIG. 3.

The DC offset correction circuit 68 of FIG. 3 preferably further includes a coarse DC offset correction path 104. The coarse DC offset correction path 104 is executed first during a receiver warm-up sequence. The coarse DC offset correction path 104 preferably includes a round and clip circuit 106, a second subtractor 110, a multiplexer 116, and a DC adjustment circuit 118. After the DC filter has settled to provide desired correction accuracy, the average DC offset 100 acquired in the feedback loop 88 is input to the round and clip circuit 106. The round and clip circuit 106 rounds and clips the average DC offset 100 from N bits of precision to M bits (precision of the digital to analog converter 70). N will typically be greater than M in most practical applications, thereby generating a rounded and clipped signal 108. The second subtractor 110 subtracts the rounded and clipped signal 108 from a previous coarse DC offset correction value 112 acquired in a previous coarse DC offset correction cycle to compute a new DC bias 114. This subtraction is necessary because the current DC bias in the RF frontend 54 must be taken into account when computing a new (or next) DC bias value. The subtractor output (the new DC bias 114) is not directly fed into the digital to analog converter 70.

In one mode of operation, the full M-bit output from the subtractor (the new DC bias 114) is fed through a multiplexer (MUX) 116 to DC bias to the full operational dynamic range of the receiver IF amplifier 64 in the RF frontend 54 as the first offset correction signal 82. This type of adjustment is used when the receiver 50 is first turned on (IE: during a cold start warm-up sequence).

In a second mode of operation, the new DC bias 114 is first input to the DC adjustment circuit 118. The DC adjustment circuit 118 makes a very small programmable DC adjustment and then inputs the adjusted signal 120 to the multiplexer 116. This type of small adjustment is performed during normal mode warm-ups after a battery save interval. The purpose of making the small adjustment is to perform a more accurate (or fine grain) DC correction adjustment. Also, it is not expected that the DC offset will vary as much after normal battery save intervals in most wireless protocols due to temperature and voltage variations. In addition, limiting the size of the correction steps after battery save intervals cause more robust mixed mode loop behavior.

Figure 4:
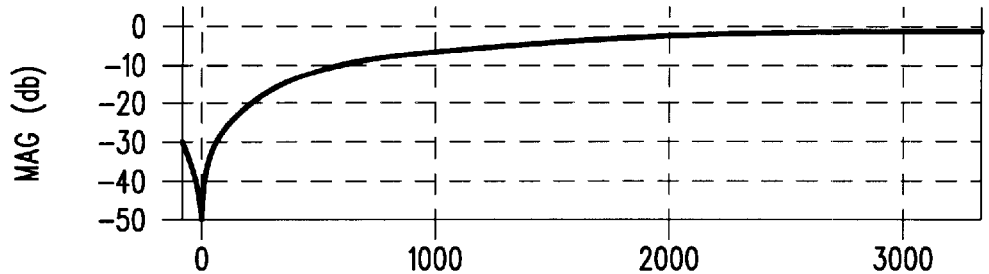
FIGS. 4 through 9 illustrates the frequency responses due to several programmable high pass filter corners of the DC offset correction circuit of FIG. 3.
Figure 5:
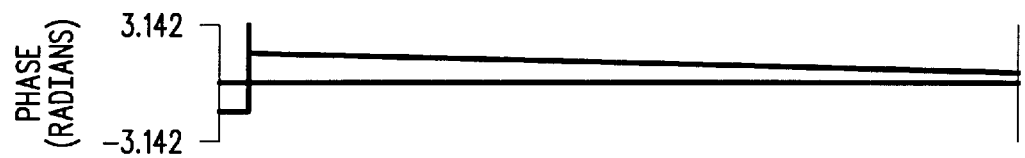
Figure 6:
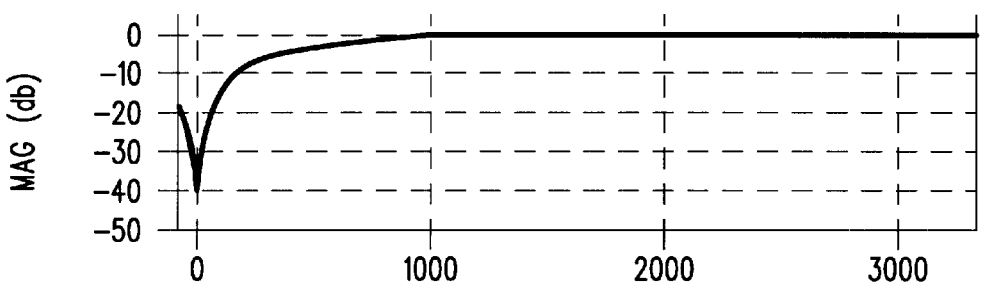
Figure 7:
Figure 8:
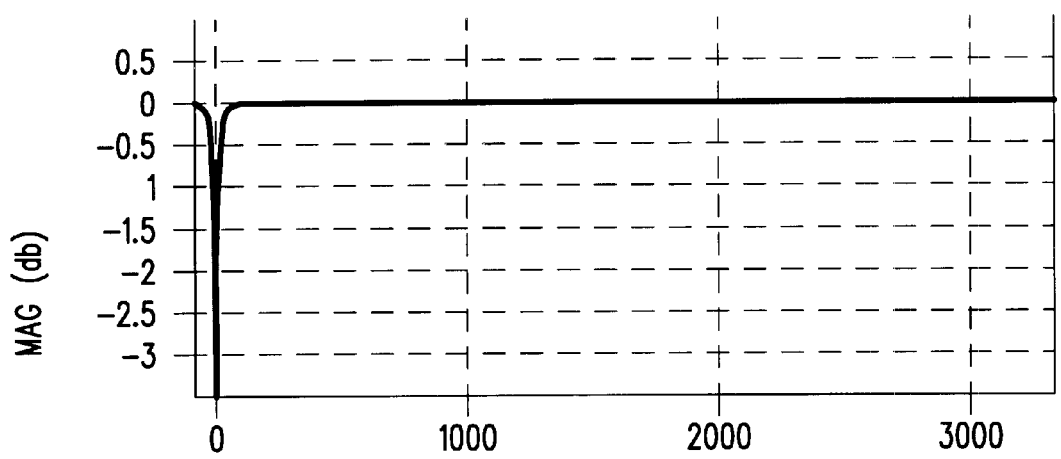
Figure 9:

FIGS. 4 through 9 illustrate the frequency responses due to several programmable high pass filter corners of the DC offset correction circuit 68 of FIG. 3. Values of "n" (amount of right shift) corresponding to the responses from top to bottom in the specified FIGS. are 2, 6, and 10 respectively. Larger values of "n" correspond to smaller resulting bandwidths. FIG. 4 is the magnitude of the DC filter response with a 2.2 KHz corner (n=2). FIG. 5 is the phase of the DC filter response with a 2.2 KHz corner (n=2). FIG. 6 is the magnitude of the DC filter response with a 493 Hz corner (n=6). FIG. 7 is the phase of the DC filter response with a 493 Hz corner (n=6). FIG. 8 is the magnitude of the DC filter response with a 7 Hz corner(n=10). FIG. 9 is the phase of the DC filter response with a 7 Hz corner (n=10).

The DC offset correction circuit 68 has several modes of operation. In coarse DC correction mode, larger DC offsets that can arise due to temperature, process, and voltage variations are initially subtracted out using the coarse DC offset correction path 104 to the RF frontend 54. As mentioned previously, this is achieved by subtracting out the new DC bias 114 from the previous coarse DC offset correction value 112 held in the digital to analog converter 70. In some applications, to maximize the accuracy of the digital to analog conversion, the dynamic range of the digital to analog converter 70 can be lower than that of the IF amplifier output 78. Thus, during a cold start warm-up process, it can be necessary to perform multiple coarse DC offset correction to accommodate the full dynamic range at the IF amplifier output 78.

Figure 10:
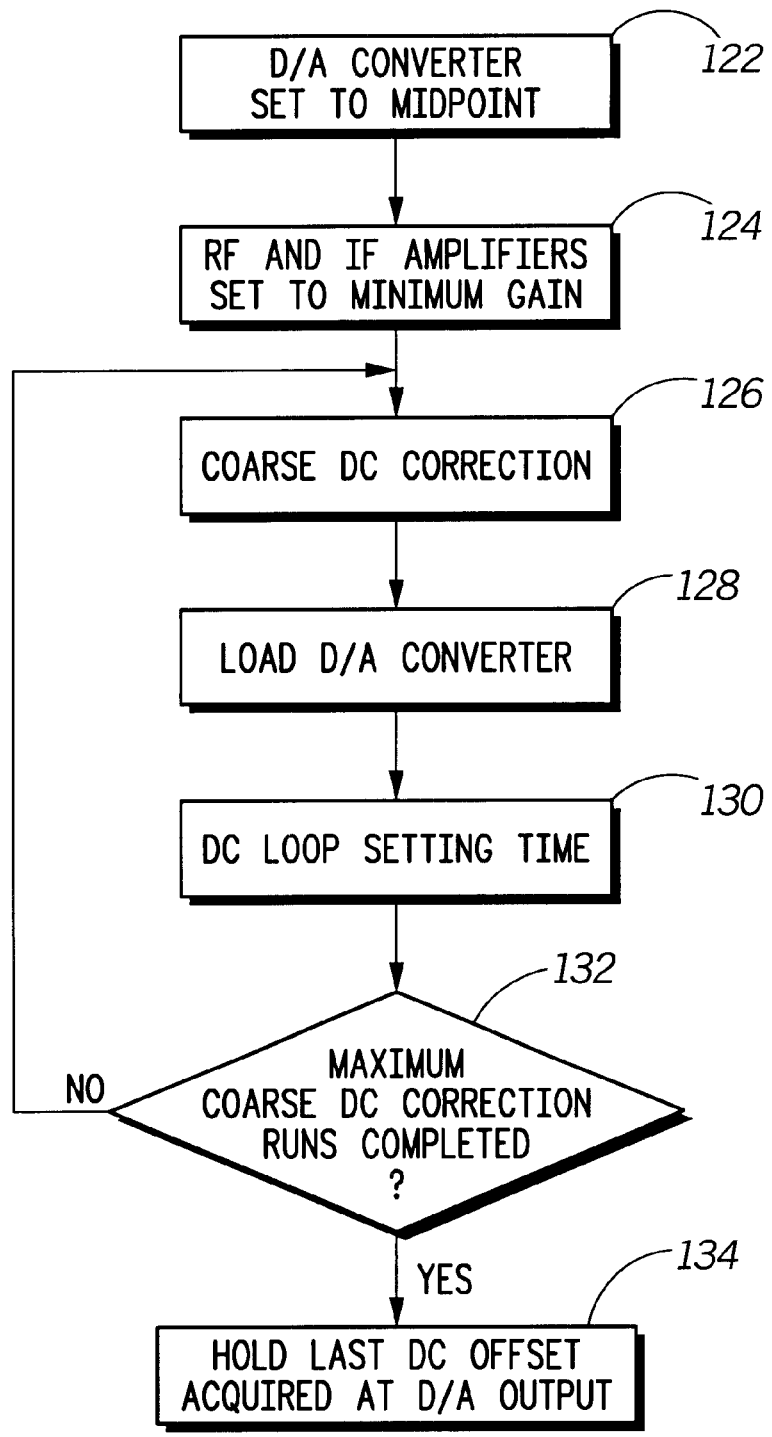
FIG. 10 is a flowchart illustrating a cold start warm-up process of the receiver of FIG. 2 using the DC offset correction circuit of FIG. 3.

FIG. 10 is a flowchart illustrating a cold start warm-up process of the receiver 50 of FIG. 2 using the DC offset correction circuit 68 of FIG. 3 involving multiple coarse DC offset corrections. In Step 122, the digital to analog converter 70 is set to its midpoint (i.e. no DC bias forced at the IF amplifier output). Next, in Step 124, the RF amplifier 58 and the receiver IF amplifier 64 are set to minimum gain to mute the RF frontend 54. This assures that the DC offset correction algorithm does not incorrectly track a strong signal with a DC content at the antenna. Next, in Step 126, coarse DC correction is performed. This is achieved by subtracting out the new DC bias 114 from the previous coarse DC offset correction value 112 held in the digital to analog converter 70. The duration of the coarse DC correction step ($T_{coarse}$) must be sufficiently long to support the LSB/2 resolution of the digital to analog converter 70. LSB is the voltage corresponding to the magnitude of the least significant bit at the output of the digital to analog converter 70. This period is essentially the settling time of the DC filter itself to achieve the specified accuracy given a worst case DC offset at the start of the coarse DC correction process. Next, in Step 128, the digital to analog converter 70 is loaded (or updated) with the new DC bias 114 and held at that value until the completion of the next coarse DC correction step. Next, in Step 130, a DC loop settling time occurs. This is a period between coarse DC corrections ($T_{loop}$) to allow for the settling time of the DC feedback loop through the RF frontend 54. The DC filter is cleared during the settling time so that it does not track any erroneous DC while the loop is settling. Next, in Step 132, it is determined whether the desired number of coarse DC corrections has been completed. When the desired number of coarse DC corrections has not been completed, the process returns to Step 126 and a coarse DC correction occurs using the DC offset acquired in the previous run as the starting condition. The purpose of running multiple back-to-back coarse DC offset corrections during a cold start warm-up is to ensure that LSB/2 correction accuracy is achieved at the end of the last run. Each successive run has a smaller DC amount to correct. When the desired number of coarse DC corrections has been completed, the process moves to Step 134 and the DC offset from the final run is held. The final DC offset correction accuracy should be LSB/2.

After the first cold start warm-up is completed, the receiver 50 will enter its normal operation mode. In this mode, it will initially be asynchronous to the transmitter of the radio communication system 30 until it achieves frame synchronization. During normal operation mode, the receiver 50 is typically turned off either periodically (in synchronous mode) or due to particular conditions (in asynchronous mode) to maximize battery life. The period during which the receiver 50 is periodically turned off is called a battery save interval.

Figure 11:
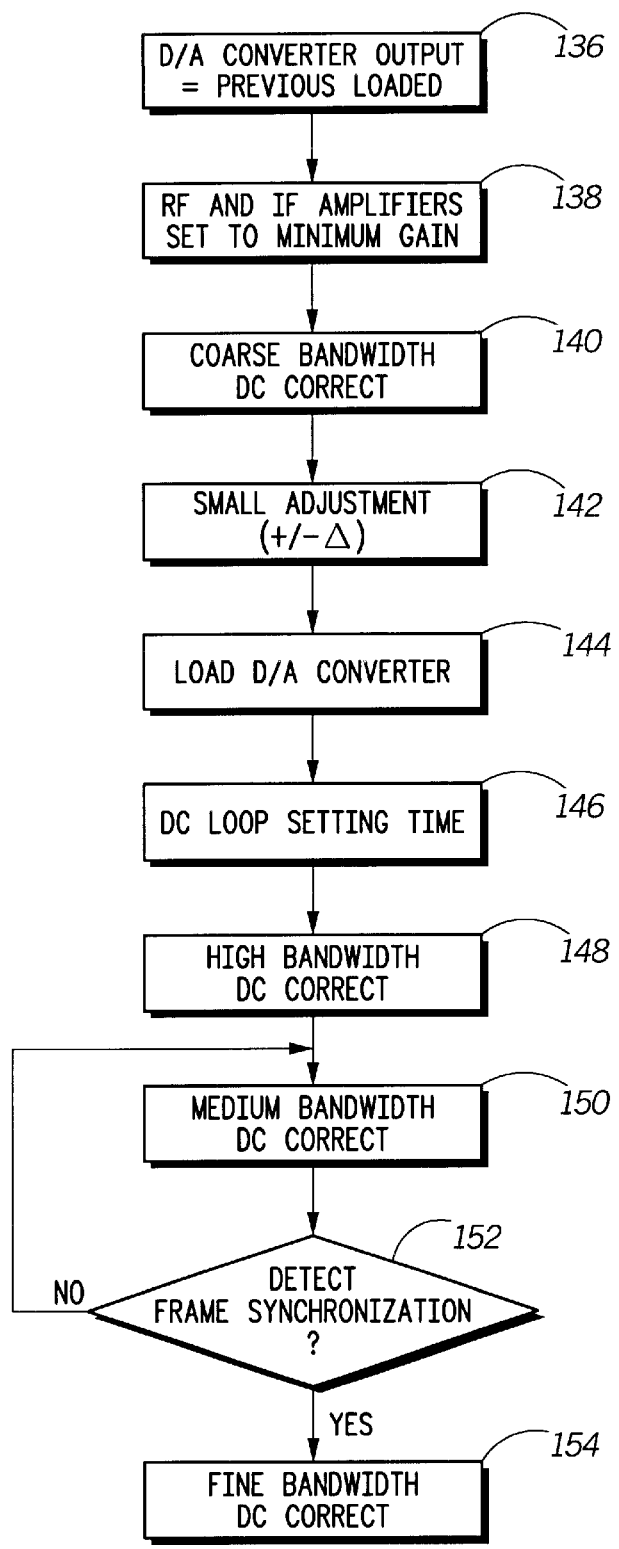
FIG. 11 is a flowchart illustrating a warm-up process during a normal mode of the receiver of FIG. 2 using the DC offset correction circuit of FIG. 3.

FIG. 11 is a flowchart illustrating a warm-up process during a normal mode of the receiver 50 of FIG. 2 using the DC offset correction circuit 68 of FIG. 3. Specifically, FIG. 11 shows the DC correction warm-up sequence in accordance with the present invention immediately after a battery save interval during normal operation mode. In Step 136, at wakeup, the output of the digital to analog converter 70 is initially held to the previous coarse DC offset correction value 112 which is the DC offset loaded into it during the previous warm-up sequence. Next, in Step 138, the RF amplifier 58 and the receiver IF amplifier 64 are set to minimum gain to mute the RF frontend 54. This assures that the DC offset correction algorithm does not incorrectly track a strong signal with a DC content at the antenna. Next, in Step 140, a coarse bandwidth DC correction is performed. This is typically using a 2 Kilohertz (KHz) corner. This is achieved by subtracting out the rounded and clipped signal 108 from the previous coarse DC offset correction value 112 held in the digital to analog converter 70. The duration of the coarse DC correction step ($T_{coarse}$) must be sufficiently long to support the LSB/2 resolution of the digital to analog converter 70. This period is essentially the settling time of the DC filter itself to achieve the specified accuracy given a worst case DC offset at the start of the coarse DC correction process. Next, in Step 142, after sufficient time has expired to correct down to the LSB/2 accuracy of the digital to analog converter 70 ($T_{coarse}$) a very small adjustment of +/−Δ is allowed. The purpose of only allowing such a small adjustment is because the analog feedback's DC correction process is typically much more accurate when correcting such smaller amounts of DC offset due to more conversion linearity in these regions. Another reason is that even though the RF frontend 54 is muted during the coarse correction step, there is still a possibility that a large interfering signal may sneak through and cause the coarse DC correction step to track it. This undesirable event could cause the loss of an entire frame of data. Also, it is not expected that the DC offset will vary much after a battery save interval in normal operation mode due to temperature and voltage variation. This is also the reason why the digital to analog converter 70 is initially set to the DC offset previously acquired. Thus, in summary, the coarse DC correction step is more robust when limiting the amount of correction allowed in this step. Nevertheless, if a large DC offset does occur abruptly in this operation mode, it will be eliminated during the remainder of the DC warm-up process as well as during successive warm-up sequences in a systematic fashion. Next, in Step 144, the digital to analog converter 70 is loaded with the first offset correction signal 82. After the RF feedback based coarse DC correction is completed, no more digital to analog converter 70 updates are allowed to occur for the remainder of the specified warm-up sequence. Next, in Step 146, a DC loop settling time occurs. This is the settling time of the mixed mode DC feedback loop through the RF frontend 54. The DC filter is cleared during the settling time so that it does not track any erroneous DC while the loop is settling.

The remainder of the DC corrections occurs in the digital signal's feedforward path. Next, in Step 148, following the settling time of the feedback loop after coarse correction, the DC filter is set to a high bandwidth mode for a sufficient amount of time. The purpose of this step is to correct out any residual DC due to the limited accuracy of the DC correction DAC. In particular, its objective is to correct out residual DC down to the LSB/2 resolution of the analog to digital converter 66. This step also eliminates any DC due to non-linearities in the analog feedback path (i.e. in digital to analog converter 70 and the receiver IF amplifier 64).

Next, in Step 150, additional DC offset correction is performed in the medium DC bandwidth correction step. Note that we do not abruptly switch from a high bandwidth mode (i.e.: 1 Kilohertz) to a fine bandwidth (i.e.: 7 Hertz) mode in one step because that can cause a large overshoot ripple in the feedback path of the DC filter. This large ripple can take a very long time to settle in the fine bandwidth mode, which is undesirable. It is for this reason that we perform a more gradual transition to reach the fine bandwidth mode through the intermediate medium bandwidth mode. In the receiver 50, during the medium bandwidth mode, the AGC (automatic gain control) and AFC (Automatic Frequency Control) are allowed to run. Next, in Step 152, the process checks for detection of a frame synchronization pattern. When no frame synchronization pattern is detected, the process returns to Step 150 and continues running the medium bandwidth correction mode. In Step 154, when the frame synchronization pattern is detected, the bandwidth can be switched to the fine bandwidth mode to eliminate any dynamic DC offsets that may occur due to self-reception during frame data reception.

The present invention, as described herein, provides an electronic circuit for the reduction of a DC offset component that, for example, is due to process, temperature, and voltage variation with an insignificant impact on sensitivity.

Although the invention has been described in terms of preferred embodiments, it will be obvious to those skilled in the art that various alterations and modifications may be made without departing from the invention. Accordingly, it is intended that all such alterations and modifications be considered as within the spirit and scope of the invention as defined by the appended claims.

What is claimed is:

1. A receiver for receiving and processing a radio frequency signal using a DC offset correction scheme within a radio communication system, the receiver comprising:

a receiver antenna for receiving the radio frequency signal;

a radio frequency frontend coupled to the receiver antenna, the radio frequency frontend comprising:

a receiver radio frequency amplifier for selecting a desired portion within a band of frequencies of the radio frequency signal, and for amplifying the desired portion, thereby generating a desired signal, a receiver local oscillator for generating a local oscillator signal, a receiver radio frequency mixer coupled to the output of the RE amplifier and coupled to the output of the local oscillator for converting the desired signal to a baseband signal using the local oscillator signal, and a receiver intermediate frequency amplifier coupled to the output of the radio frequency mixer for providing a programmable intermediate frequency gain to amplify the baseband signal, thereby generating an intermediate frequency amplifier output; and a baseband backend coupled to the radio frequency frontend, the baseband backend comprising:

an anti-aliasing filter for receiving the intermediate frequency amplifier output and for attenuating a plurality of frequency bands, thereby generating an anti-aliasing filter output, an analog to digital converter coupled to the output of the anti-aliasing filter for converting the anti-aliasing filter output from an analog format to a digital format, thereby generating a digital signal, a DC offset correction circuit coupled to the output of the analog to digital converter for receiving the digital signal and for calculating the average DC offset and correcting it, thereby generating a first offset correction signal and a second offset correction signal, and a digital to analog converter coupled to the output of the DC offset correction circuit for conversion of the first offset correction signal to analog form, thereby generating an analog signal, wherein the analog signal is used to DC bias the output of the receiver intermediate frequency amplifier.

2. The receiver as recited in claim 1 wherein the DC offset correction circuit comprises:

a feedback loop for shifting the digital signal by a programmable amount; and a coarse DC offset correction path coupled to the feedback loop for performing coarse DC offset correction.

3. The receiver as recited in claim 2 wherein the feedback loop comprises:

a shifter for shifting the digital signal by the programmable amount, thereby generating a shifted signal;

a rounder coupled to the shifter for performing rounding on the shifted signal, thereby generating a rounded signal;

an integrator coupled to the rounder for averaging the rounded signal, thereby generating an average DC offset; and a first subtractor coupled to the integrator for subtracting the average DC offset from the digital signal.

4. The receiver as recited in claim 2 wherein the coarse DC offset correction path comprises:

a round and clip circuit for rounding and clipping the average DC offset, thereby generating a rounded and clipped signal;

a second subtractor coupled to the round and clip circuit for subtracting the rounded and clipped signal from a previous coarse DC offset correction signal, thereby generating a new DC bias; and a multiplexer coupled to the second subtractor for multiplexing the new DC bias.

5. The receiver as recited in claim 4, wherein the coarse DC offset correction path further comprises:

a DC adjustment circuit coupled to the second subtractor, wherein the DC adjustment circuit makes a very small DC adjustment to the new DC bias and then inputs the adjusted signal to the multiplexer.

6. A DC offset correction circuit for providing DC offset correction within a receiver for receiving and processing a radio frequency signal within a radio communication system, the DC offset correction circuit comprising:

a feedback loop for shifting a digital signal by a programmable amount, wherein the feedback loop comprises:

a shifter for shifting the digital signal by the programmable amount, thereby generating a shifted signal;

a rounder coupled to the shifter for performing rounding on the shifted signal, thereby generating a rounded signal;

an integrator coupled to the rounder for averaging the rounded signal, thereby generating an average DC offset; and a first subtractor coupled to the integrator for subtracting the average DC offset from the digital signal; and a coarse DC offset correction path coupled to the feedback loop for performing coarse DC offset correction.

7. A DC offset correction circuit for providing DC offset correction within a receiver for receiving and processing a radio frequency signal within a radio communication system, the DC offset correction circuit comprising:

a feedback loop for shifting a digital signal by a programmable amount; and a coarse DC offset correction path coupled to the feedback loop for performing coarse DC offset correction, wherein the coarse DC offset correction path comprises:

a round and clip circuit for rounding and clipping the average DC offset, thereby generating a rounded and clipped signal;

a second subtractor coupled to the round and clip circuit for subtracting the rounded and clipped signal from a previous coarse DC offset correction signal, thereby generating a new DC bias; and a multiplexer coupled to the second subtractor for multiplexing the new DC bias.

8. The DC offset correction circuit as recited in claim 7, wherein the coarse DC offset correction path further comprises:

a DC adjustment circuit coupled to the second subtractor, wherein the DC adjustment circuit makes a very small DC adjustment to the new DC bias and then inputs the adjusted signal to the multiplexer.

* * * * *